United States Patent
Fujii et al.

(10) Patent No.: US 10,894,403 B2
(45) Date of Patent: Jan. 19, 2021

(54) SEMICONDUCTOR APPARATUS, LIQUID DISCHARGE HEAD SUBSTRATE, LIQUID DISCHARGE HEAD, AND LIQUID DISCHARGE APPARATUS

(71) Applicant: CANON KABUSHIKI KAISHA, Tokyo (JP)

(72) Inventors: Kazunari Fujii, Tokyo (JP); Naoki Isoda, Tokyo (JP); Toshio Negishi, Yokohama (JP); Wataru Endo, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 100 days.

(21) Appl. No.: 15/927,431

(22) Filed: Mar. 21, 2018

(65) Prior Publication Data

US 2018/0281390 A1    Oct. 4, 2018

(30) Foreign Application Priority Data

Mar. 30, 2017 (JP) .................................. 2017-068692

(51) Int. Cl.
*B41J 2/045* (2006.01)
*H01L 23/525* (2006.01)
(Continued)

(52) U.S. Cl.
CPC ......... *B41J 2/04541* (2013.01); *B41J 2/0458* (2013.01); *B41J 2/04511* (2013.01);
(Continued)

(58) Field of Classification Search
CPC .................... B41J 2202/13; B41J 2/04511; B41J 2/04541; B41J 2/04543; B41J 2/0458; B41J 2/04586; B41J 2002/14491; B41J 2202/17; B41J 29/38; B41J 2/14; B41J 2/145; B41J 2/17513; H01L 23/5252; H01L 27/11206; H01L 27/101; H01L 27/112; H01L 27/0629; H01L 28/20; G11C 17/18; G11C 17/165
See application file for complete search history.

(56) References Cited

U.S. PATENT DOCUMENTS

| | | | |
|---|---|---|---|
| 10,566,069 B2* | 2/2020 | Fujii | B41J 2/04563 |
| 2009/0262567 A1* | 10/2009 | Shin | G11C 17/18 |
| | | | 365/96 |
| 2014/0078223 A1* | 3/2014 | Ohmura | B41J 2/04541 |
| | | | 347/56 |

FOREIGN PATENT DOCUMENTS

| | | |
|---|---|---|
| JP | H11-238807 A | 8/1999 |
| JP | 2009-259384 A | 11/2009 |
| JP | 2014-58130 A | 4/2014 |

* cited by examiner

*Primary Examiner* — Jannelle M Lebron
(74) *Attorney, Agent, or Firm* — Canon U.S.A., Inc. IP Division

(57) ABSTRACT

An apparatus includes a substrate, a transistor provided on the substrate and connected to a first terminal supplied with a first voltage, an anti-fuse element provided on the substrate and connected between the transistor and a second terminal supplied with a second voltage, a first resistive element provided on the substrate and connected in parallel to the anti-fuse element and between the transistor and the second terminal, and an adjusting unit provided on the substrate and configured to function so as to reduce an influence of variation in resistance of the first resistive element in reading out of information from the anti-fuse element.

22 Claims, 8 Drawing Sheets

(51) Int. Cl.
*H01L 49/02* (2006.01)
*H01L 27/06* (2006.01)
*H01L 27/112* (2006.01)
*G11C 17/16* (2006.01)
*B41J 2/175* (2006.01)
*B41J 2/14* (2006.01)
*B41J 2/145* (2006.01)
*B41J 29/38* (2006.01)
*G11C 17/18* (2006.01)

(52) U.S. Cl.
CPC ....... *B41J 2/04543* (2013.01); *B41J 2/04586* (2013.01); *B41J 2/14* (2013.01); *B41J 2/145* (2013.01); *B41J 2/17513* (2013.01); *B41J 29/38* (2013.01); *G11C 17/165* (2013.01); *G11C 17/18* (2013.01); *H01L 23/5252* (2013.01); *H01L 27/0629* (2013.01); *H01L 27/11206* (2013.01); *H01L 28/20* (2013.01); *B41J 2002/14491* (2013.01); *B41J 2202/13* (2013.01); *B41J 2202/17* (2013.01)

US 10,894,403 B2

SEMICONDUCTOR APPARATUS, LIQUID DISCHARGE HEAD SUBSTRATE, LIQUID DISCHARGE HEAD, AND LIQUID DISCHARGE APPARATUS

BACKGROUND OF THE INVENTION

Field of the Invention

One aspect of the embodiments relates to a semiconductor apparatus including an anti-fuse element, a liquid discharge head substrate, a liquid discharge head, or a liquid discharge apparatus.

Description of the Related Art

One time programmable (OTP) memories for recording product specific information, such as chip identifiers or setting parameters, after the products are manufactured are used in semiconductor apparatuses in recent years. The OTP memories are of two kinds: the OTP memories using fuse elements and the OTP memories using anti-fuse elements. A technology using the anti-fuse element is disclosed in, for example, Japanese Patent Laid-Open No. 2014-58130.

SUMMARY OF THE INVENTION

One aspect of the embodiments provides a semiconductor apparatus including a semiconductor substrate; a transistor provided on the semiconductor substrate and connected to a first terminal supplied with a first voltage; an anti-fuse element provided on the semiconductor substrate and connected between the transistor and a second terminal supplied with a second voltage; a first resistive element provided on the semiconductor substrate and connected in parallel to the anti-fuse element and between the transistor and the second terminal; and a current supply unit including a current supply transistor provided on the semiconductor substrate, the current supply unit being configured to supply a current to the anti-fuse element and the first resistive element.

Another aspect of the embodiments provides a semiconductor apparatus including a semiconductor substrate; a transistor provided on the semiconductor substrate and connected to a first terminal supplied with a first voltage; an anti-fuse element provided on the semiconductor substrate and connected between the transistor and a second terminal supplied with a second voltage; a first resistive element provided on the semiconductor substrate and connected in parallel to the anti-fuse element and between the transistor and the second terminal; a third terminal provided on the semiconductor substrate, to which an external current is supplied; and a second resistive element connected between the third terminal and the second terminal.

Another aspect of the embodiments provides a semiconductor apparatus including a semiconductor substrate; a transistor provided on the semiconductor substrate and connected to a first terminal supplied with a first voltage; an anti-fuse element provided on the semiconductor substrate and connected between the transistor and a second terminal supplied with a second voltage; a first resistive element provided on the semiconductor substrate and connected in parallel to the anti-fuse element and between the transistor and the second terminal; and an adjusting unit provided on the semiconductor substrate and configured to function so as to reduce an influence of variation in resistance of the first resistive element in reading out of information from the anti-fuse element.

Further features of the disclosure will become apparent from the following description of exemplary embodiments with reference to the attached drawings.

DESCRIPTION OF THE EMBODIMENTS

First Embodiment

Reading errors may occur due to manufacturing variation in the resistance value of a resistor connected in parallel to an anti-fuse memory element and change associated with temperature variation caused by environment or printing conditions. Some embodiments of the present disclosure may reduce reading errors.

Figure 1:
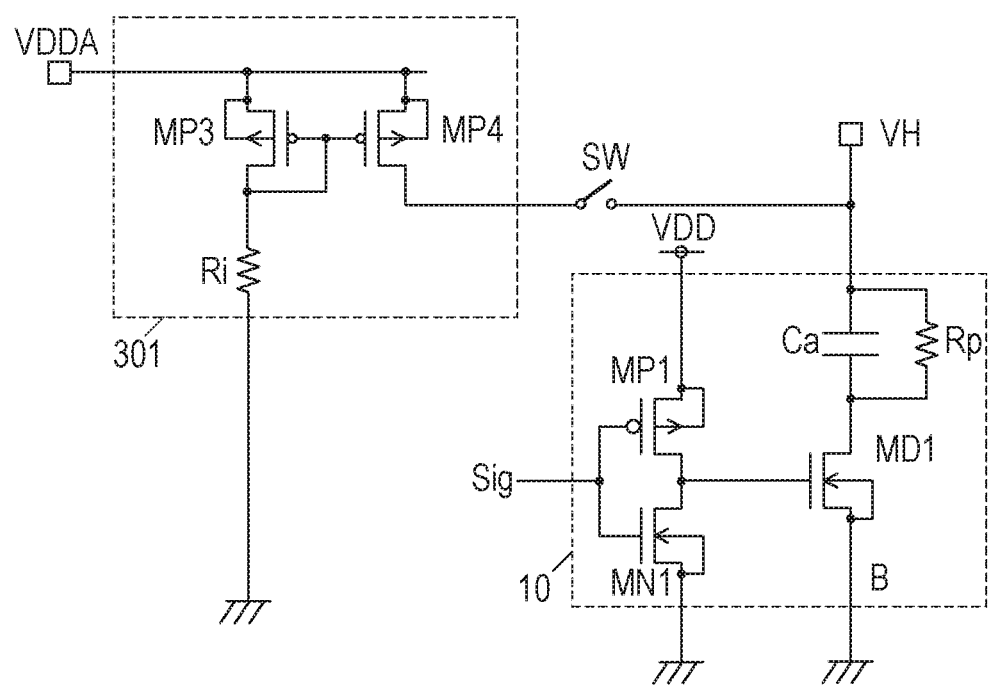
FIG. 1 is a circuit diagram illustrating an exemplary circuit configuration of a semiconductor apparatus according to a first embodiment.

FIG. 1 is a circuit diagram illustrating an exemplary circuit configuration of a semiconductor apparatus according to a first embodiment. A state before information is written into an anti-fuse element is illustrated in FIG. 1.

The semiconductor apparatus of the first embodiment includes a memory unit 10 and a first terminal VH. The memory unit 10 includes a transistor MP1, a transistor MN1, a transistor MD1, an anti-fuse element 11, and a resistive element Rp (a resistor portion). In the first embodiment, the resistance value of the anti-fuse element 11 is varied in response to an operation to write information. The anti-fuse element 11 has a first resistance value before information is written into the anti-fuse element 11 and has a second resistance value lower than the first resistance value after information is written into the anti-fuse element 11. In one embodiment, the first resistance value is high. The first resistance value may ideally be infinite.

The difference between the first resistance value and the second resistance value is large. For example, the anti-fuse element 11 functions as a capacitive element Ca before information is written into the anti-fuse element 11 and functions as a resistive element after information is written into the anti-fuse element 11. Since the state before which information is written into the anti-fuse element 11 is illustrated in FIG. 1, the anti-fuse element 11 is represented by a circuit symbol of the capacitive element Ca.

With the above configuration, the information written into the anti-fuse element 11 is capable of being read out based on the variation in the resistance value of the anti-fuse element 11. In this specification, the resistance value may be acquired as direct-current resistance.

Referring to FIG. 1, the transistor MP1 is a P-type transistor and the transistor MN1 is an N-type transistor. A control signal Sig is input into the gates of the transistor MP1 and the transistor MN1.

Power supply voltage VDD is supplied to one terminal of the source and the drain of the transistor MP1 and the back gate of the transistor MP1. The other terminal of the source and the drain of the transistor MP1 is connected to one terminal of the source and the drain of the transistor MN1 and the gate of the transistor MD1. The other terminal of the source and the drain of the transistor MN1 and the back gate of the transistor MN1 is grounded. The transistor MP1 and the transistor MN1 form a logic circuit (an inverter in FIG. 1).

The transistor MD1 is a high breakdown-voltage transistor and controls application of voltage to the anti-fuse element 11. For example, the transistor MD1 may be an N-channel metal oxide semiconductor (NMOS) transistor. Here, the high breakdown-voltage transistor has breakdown voltage higher than those of transistors (for example, the transistor MP1 and the transistor MN1) used in the logic circuit. The high breakdown-voltage transistor is formed so as not to fail even if high voltage that is intolerable for a transistor in a general logic circuit, such as a controller, is applied. Using transistors having breakdown voltages lower than that of the transistor MD1 as the transistor MP1 and the transistor MN1 composing the logic circuit enables the logic circuit to operate at high speed.

The anti-fuse element 11 is connected to a second terminal B having second voltage with the transistor MD1 interposed therebetween. An anti-fuse element having a metal oxide semiconductor (MOS) structure may be used as the anti-fuse element 11. The resistive element Rp is connected to the second terminal B with the transistor MD1 interposed therebetween and is connected in parallel to the anti-fuse element 11 (the resistive element Rp is hereinafter also referred to as the parallel resistive element Rp). The anti-fuse element 11 and the resistive element Rp are connected to the first terminal VH having first voltage.

The first terminal VH and the second terminal B are pads for electrically connecting the memory unit 10 to an external element and are terminals used to apply voltage to the anti-fuse element 11 or to measure the voltage thereof. For example, the first terminal VH may have high voltage Vh (for example, 32 V) in writing of information. In reading out of information to determine whether the anti-fuse element 11 is in the writing state, the determination may be based on the result of detection of the voltage at the first terminal VH. The voltage of the second terminal B may be, for example, ground potential.

Specifically, one terminal of the source and the drain of the transistor MD1 is connected to one terminal of the anti-fuse element 11 and one terminal of the resistive element Rp. The other terminal of the source and the drain of the transistor MD1 is connected to the second terminal B having the ground potential. The other terminal of the anti-fuse element 11 is connected to the other terminal of the resistive element Rp to be connected to the first terminal VH.

When the transistor MD1 is in an off state, the resistive element Rp provided in parallel with the anti-fuse element 11 makes the voltage of one terminal of the capacitive element Ca, which is the anti-fuse element 11, substantially equal to the voltage of the other terminal thereof.

A writing operation will now be described. In writing of information into the anti-fuse element 11, the control signal Sig corresponding to the anti-fuse element 11 into which information is to be written is set to an low-level signal (for example, a signal of the ground potential) to set the transistor MD1 to an on state. Accordingly, the high voltage Vh is applied to a gate insulating film of the anti-fuse element 11. As a result, the gate insulating film of the anti-fuse element 11 is subjected to dielectric breakdown to greatly decrease the resistance value of the anti-fuse element 11. Consequently, the anti-fuse element 11 is the capacitive element Ca before the writing while the anti-fuse element 11 becomes a resistive element after the writing.

A reading operation will now be described. The control signal Sig corresponding to the anti-fuse element 11 from which information is to be read out is set to the low-level signal (for example, a signal of the ground potential) to set the transistor MD1 to the on state. In this state, current is supplied to the anti-fuse element 11 or the resistive element Rp or to both the anti-fuse element 11 and the resistive element Rp. The resistance value of the anti-fuse element 11 is varied depending on whether information is written into the anti-fuse element 11. Accordingly, the combined resistance of the resistances of the anti-fuse element 11 and the resistive element Rp is varied depending on whether information is written into the anti-fuse element 11. As a result, the voltage between both terminals of the parallel resistive element Rp is also varied depending on whether information is written into the anti-fuse element 11.

For example, since the anti-fuse element 11 is in the state of the capacitive element before information is written into the anti-fuse element 11 in FIG. 1, the resistance of the anti-fuse element 11 is greatly higher than the resistance of the parallel resistive element Rp. Accordingly, the resistance of the parallel resistive element Rp is a dominant factor on the voltage drop between both terminals of the parallel resistive element Rp. In contrast, when information is written into the anti-fuse element 11, the resistance of the anti-fuse element 11 is greatly lower than the resistance of the parallel resistive element Rp. Accordingly, the resistance of the anti-fuse element 11 is a dominant factor on the voltage drop between both terminals of the parallel resistive element Rp.

The parallel resistive element Rp is configured so as to have the resistance value sufficiently higher than the resistance value of the anti-fuse element 11 after information is written into the anti-fuse element 11. Accordingly, the voltage drop between both terminals of the parallel resistive element Rp when information is written into the anti-fuse element 11 is smaller than that when information is not written into the anti-fuse element 11. In other words, the voltage of one terminal or the other terminal of the parallel resistive element Rp is varied depending on whether information is written into the anti-fuse element 11.

Consequently, the information indicating whether information is written into the anti-fuse element 11 is capable of being read by measuring the voltage of one terminal or the other terminal of the parallel resistive element Rp when the transistor MD1 is set to the on state.

Setting the resistance of the parallel resistive element Rp to a value sufficiently higher than the resistance of the anti-fuse element 11 after information is written into the anti-fuse element 11 enables the difference in voltage between when information is written into the anti-fuse element 11 and when information is not written into the anti-fuse element 11 to be increased, thus improving the reading accuracy.

The resistance of the parallel resistive element Rp may be shifted from a design value due to manufacturing variation or the like to be varied for each semiconductor apparatus. Shifting the resistance of the parallel resistive element Rp from the design value varies the voltage value to be read out. Accordingly, in the determination of whether information is written into the anti-fuse element 11, the voltage determined to be the voltage when information is written into the anti-fuse element 11 may be actually the voltage when information is not written into the anti-fuse element 11 or the reverse phenomenon may occur to decrease the reading accuracy.

In reading out of information from the anti-fuse element 11, the semiconductor apparatus may be configured so as to include an adjusting unit to reduce the influence of the variation (the shift from the design value) in the resistance of the parallel resistive element Rp to improve the reliability in the reading.

A current supply unit that is provided on the same substrate as that of the resistive element Rp and that supplies current for cancelling the variation (shift) in the resistance of the resistive element Rp may be used as the adjusting unit.

Specifically, the current supply unit including a transistor MP3 and a transistor MP4 functions as the adjusting unit. Providing the transistors in the current supply unit enables the current for cancelling the variation (shift) in the resistance of the resistive element Rp to be supplied.

For example, connection of an additional resistive element provided on the same substrate as that of the resistive element Rp to the current supply unit causes the current supply unit to output current corresponding to the resistance value of the additional resistive element. Since the additional resistive element and the parallel resistive element Rp are formed on the same substrate, the additional resistive element and the parallel resistive element Rp have similar variation (shift) in characteristics. As a result, the current supply unit is capable of supplying the current for cancelling the variation (shift) in the resistance of the resistive element Rp.

In another example, varying the current output from the current supply unit in accordance with the temperature of the resistive element Rp, which is measured by a temperature sensor, enables the accurate reading to be performed regardless of the variation in the resistance value of the resistive element Rp.

In another example, controlling operation conditions of the transistor MD1 using the current output from the current supply unit enables the accurate reading to be performed regardless of the variation in the resistance of the resistive element Rp. Providing the current supply unit including the transistors on the same substrate as that of the resistive element Rp enables the reliability in the reading to be improved.

As another example of the adjusting unit, a resistive element configured so as to cancel the variation (shift) in the resistance of the resistive element Rp using partial pressure may be used. In this example, providing the resistive element on the same substrate as that of the resistive element Rp may enable the function of the adjusting unit to be realized. Accordingly, it is not necessary to use the current supply unit described above.

As described above, according to the first embodiment, in the reading of information from the anti-fuse element 11, configuring the semiconductor apparatus so as to include the adjusting unit, which reduces the influence of the variation (the shift from the design value) in the resistance of the parallel resistive element Rp, enables the reliability in the reading to be improved. Specific configurations of the adjusting unit will be described in detail in the following embodiments. Second embodiment An example will be described in a second embodiment with reference to FIG. 1, in which the amount of current to be supplied to the anti-fuse element 11 and the resistive element Rp in reading is varied in accordance with the resistance value of the parallel resistive element Rp to prevent a reduction in the reliability in the reading. Here, an example is described in which a current supply unit 301 provided on the same substrate as that of the resistive element Rp is included as the adjusting unit for reducing the influence of the variation (the shift from the design value) in the resistance of the parallel resistive element Rp in reading out of information from the anti-fuse element 11.

Referring to FIG. 1, the semiconductor apparatus includes the memory unit 10 including the anti-fuse element 11 and the parallel resistive element Rp, a switch SW, and the current supply unit 301 that supplies current to the anti-fuse element 11 and the parallel resistive element Rp. The current supply unit 301 includes a current generation resistor Ri and the transistors MP3 and MP4 composing a current mirror, which is a power supply. The current supply unit 301 is provided on the same semiconductor substrate as that of the parallel resistive element Rp. The switch SW is connected between the current supply unit 301 and the first terminal VH.

The sources and the back gates of the transistor MP3 and the transistor MP4 are connected to an analog power supply VDDA. The gates of the transistor MP3 and the transistor MP4 are connected to each other and are connected to the drain of the transistor MP3. The drain of the transistor MP3 is connected to one terminal of the current generation resistor Ri and the other terminal of the current generation resistor Ri is grounded. The drain of the transistor MP4 is connected to one terminal of the switch SW and the other terminal of the switch SW is connected to the capacitive element Ca and the resistive element Rp. Accordingly, the current determined by the current generation resistor Ri is supplied to the anti-fuse element 11 and the parallel resistive element Rp through the current mirror. The switch SW may be composed of, for example, a high breakdown-voltage MOS.

The switch SW is controlled by a controller (not illustrated) so that the switch SW is in the off state when information is written into the anti-fuse element 11 because the high voltage is applied and is in the on state when the information stored in the anti-fuse element 11 is read out.

A writing operation of the semiconductor apparatus illustrated in FIG. 1 will now be specifically described.

The switch SW is set to the off state and the low-level signal is input as the control signal Sig. This sets the transistor MD1 to the on state and causes the anti-fuse element 11 to be changed from the state of the capacitive element Ca to the state of the resistive element. The connection of the switch SW to the current supply unit 301 and the first terminal VH in the above manner prevents the high voltage in the writing from being supplied to the current supply unit 301. In addition, a protective element or a current limiting resistor against intrusion of very high surge charge caused by electro-static discharge (ESD) that is not intended may be disposed at a node connected to the first terminal VH (not illustrated).

A reading operation will now be described. The switch SW corresponding to the anti-fuse element 11 from which information is to be read out is set to the on state and the low level signal (for example, the signal of the ground potential) is input as the control signal Sig to set the transistor MD1 to the on state. Current flows from the current supply unit 301 to the anti-fuse element 11, which is the capacitive element Ca, and the parallel resistive element Rp through the switch SW and the first terminal VH has a voltage value corresponding to the current value, the anti-fuse element 11, and the resistive element Rp. The current value here is defined by the resistance value of the current generation resistor Ri.

When the anti-fuse element 11 is the capacitive element before information is written into the anti-fuse element 11, voltage corresponding to the combined resistance of the resistance value of the parallel resistive element Rp and on resistance of the transistor MD1 occurs at the first terminal VH. In contrast, after information is written into the anti-fuse element 11, voltage corresponding to the combined resistance of the resistance value of the anti-fuse element 11 after information is written into the anti-fuse element 11, the resistance value of the parallel resistive element Rp, and the on resistance of the transistor MD1 occurs at the first terminal VH. Accordingly, whether information is written into the anti-fuse element 11 is determined by measuring the voltage at the first terminal VH.

As described above in the first embodiment, the resistance value of the resistive element Rp is set to a value sufficiently higher than the resistance value of the anti-fuse element 11 after information is written into the anti-fuse element 11. This causes the difference in voltage between when information is written into the anti-fuse element 11 and when information is not written into the anti-fuse element 11 to be large enough to determine whether information is written into the anti-fuse element 11, thus improving the reading accuracy.

The information to be recorded on the anti-fuse element is product specific information, such as chip identifiers or setting parameters, and is written in the factory using an inspection machine or the like at product delivery time. Alternatively, when the anti-fuse element is installed on the product body and a user writes information into the anti-fuse element after the product is started to be used, voltage corresponding to the high voltage Vh is supplied from the product body.

In one embodiment, the parallel resistive element Rp has a resistance value of at least several tens of kiloohm in order to increase the difference in the resistance value between before information is written into the anti-fuse element 11 and after information is written into the anti-fuse element 11 and, for example, a diffused resistor using diffusion may be used as the high-resistance element. However, the resistance value of the diffused resistor has large manufacturing variation. In addition, the resistance value of the diffused resistor is greatly varied with the temperature and has a temperature coefficient of 1,000 ppm/° C. or more.

Since the resistance value of the resistive element Rp is dominant before information is written into the anti-fuse element 11, among the resistance values of the anti-fuse element 11 and the resistive element Rp, the resistance values in the state in which information is not written into the anti-fuse element 11 are varied with the temperature. As described above, the value of the reading voltage, which depends on whether information is written into the anti-fuse element 11 or not, is varied with the resistance value of the resistive element Rp. Accordingly, when the resistance value of the resistive element Rp is greatly varied, it may be difficult to accurately write or read out information.

For example, a case will be described in which the manufacturing variation in the resistance value of the parallel resistive element Rp is ±50% and the temperature characteristics of the parallel resistive element Rp are 4,000 ppm/° C. Since the temperature characteristics of the parallel resistive element Rp are 4,000 ppm/° C., the resistance value of the parallel resistive element Rp is varied by 40% when the temperature is varied from 0° C. to 100° C. Accordingly, when 50° C. is centered on, the resistance value of the parallel resistive element Rp is varied within a range from −20% to +20% with respect to the resistance with no variation (no shift from the design value). In addition, since the manufacturing variation is ±50%, the resistance value of the parallel resistive element Rp is varied within a range from −60% to +80% with respect to the resistance with no variation (no shift from the design value) when the manufacturing variation and the temperature variation are summed up.

Before information is written into the anti-fuse element 11, the anti-fuse element 11 is considered as the capacitance. Accordingly, since the resistance value of the parallel resistive element Rp is dominant, among the resistance values of the anti-fuse element 11 and the parallel resistive element Rp, which are connected in parallel to each other, the resistance value before information is written into the anti-fuse element 11 is varied for each semiconductor apparatus within a range from −60% to +80% due to the manufacturing variation and the temperature variation. This variation may cause a reduction in the reliability in the reading. Accordingly, in the second embodiment, the current supply unit is provided on the substrate on which the resistive element Rp is provided to improve the reliability in the reading.

Specifically, in the second embodiment, the amount of current to be supplied to the anti-fuse element 11 and the parallel resistive element Rp in the reading is varied in accordance with the resistance value of the parallel resistive element Rp to suppress a reduction in the reliability in the reading. In the second embodiment, the current generation resistor Ri, which determines the amount of current to be supplied in the reading, has the same configuration as that of the parallel resistive element Rp. The same configuration means the diffused resistor formed through the same process. Specifically, impurities are concurrently introduced into also an area where the current generation resistor Ri is to be formed in an impurity introducing process for forming the parallel resistive element Rp. Accordingly, the parallel resistive element Rp and the current generation resistor Ri, which have the same configuration, have the same impurity concentration. In one embodiment, the parallel resistive element Rp and the current generation resistor Ri have the same width and the same length.

The on resistances of the transistor MP3, the transistor MP4, and the transistor MD1 is sufficiently smaller than the resistances of the current generation resistor Ri and the parallel resistive element Rp. Here, voltage VHout at the first terminal VH in the reading in the state in which information is not written into the anti-fuse element 11 (in the state in which the anti-fuse element 11 is the capacitive element) is represented by the following equation:

$$VHout = C \times Rp/Ri \tag{1}$$

where, C denotes a constant ($\cong VDDA$).

Since the parallel resistive element Rp and the current generation resistor Ri are formed through the same process (have the same configuration), the parallel resistive element Rp and the current generation resistor Ri have similar shifts even when the resistance values of the parallel resistive element Rp and the current generation resistor Ri are shifted from the design value or a theoretical value. Accordingly, since the variations are offset if the parallel resistive element Rp and the current generation resistor Ri are in the same temperature environment even when the resistance values of the parallel resistive element Rp and the current generation resistor Ri are varied (shifted) according to the above equation, the voltage VHout does not depend on the variations in the resistance values of the parallel resistive element Rp and the current generation resistor Ri. Consequently, in the reading of information from the anti-fuse element 11, it is possible to suppress or eliminate the influence of the manufacturing variation or the temperature variation.

Although the variations in the characteristics of the transistor MP3, the transistor MP4, and the transistor MD1 practically have effects on the reading of information from the anti-fuse element 11, writing and reading errors are capable of being greatly reduced because the amounts of variations in the characteristics of the transistor MP3, the transistor MP4, and the transistor MD1 are very smaller than the variation in the resistance of the diffused resistor.

Although the same diffused resistor is used for the parallel resistive element Rp and the current generation resistor Ri and the parallel resistive element Rp and the current generation resistor Ri are configured so as to have the same width and the same length in order to reduce the relative variation of the parallel resistive element Rp and the current generation resistor Ri in the second embodiment, it is sufficient to reduce the variation in the reading voltage and the configurations of the parallel resistive element Rp and the current generation resistor Ri are not limited to the above ones. Although the current supply unit 301 is described so as to have the circuit configuration illustrated in FIG. 1 in the second embodiment, the current supply unit 301 may have any configuration as long as the amount of current from the current supply unit 301 correlates with the parallel resistive element Rp and the variation in the reading voltage is capable of being reduced. For example, the semiconductor apparatus may be configured so as to include a temperature sensor and the current supply unit may be configured so as to supply current for reducing the temperature variation (shift) of the resistive element Rp based on the result of detection with the temperature sensor.

Figure 2:
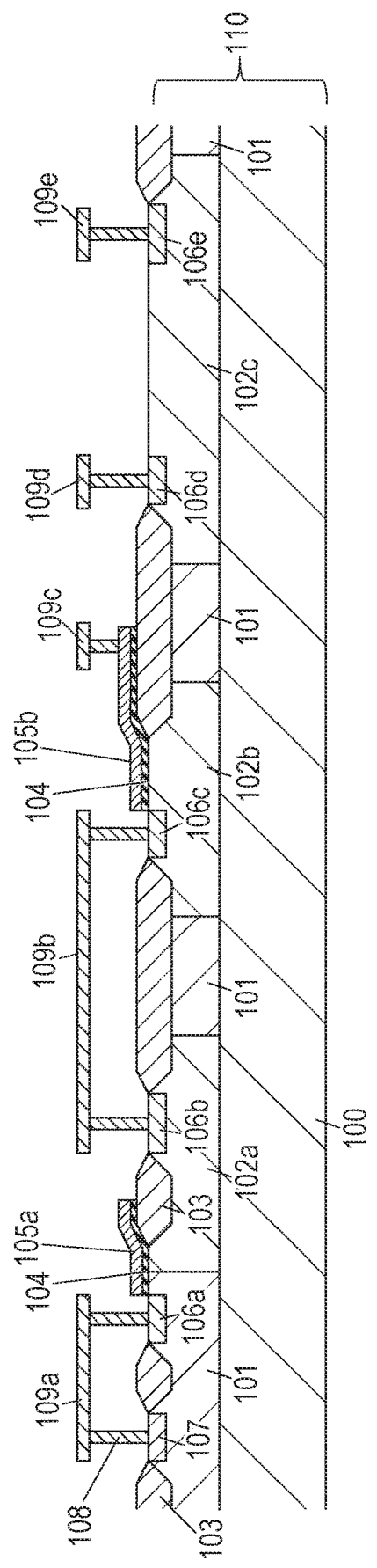
FIG. 2 is a cross-sectional view for describing part of a semiconductor apparatus according to a second embodiment.

FIG. 2 illustrates a specific example of the cross-sectional structure of the capacitive element Ca, the resistive element Rp, and the transistor MD1 illustrated in FIG. 1.

In a semiconductor substrate 110, P well regions 101 and N well region 102a, 102b, and 102c are formed on a P-type silicon substrate 100. The P well regions 101 are capable of being formed through the same process as that of P well regions of an NMOS transistor composing a logic circuit. The N well regions 102a, 102b, and 102c are capable of being formed through the same process as that of N well regions of a P-channel metal oxide semiconductor (PMOS) transistor composing a logic circuit.

The impurity concentration of the N well regions for the P-type silicon substrate 100 is set to a value at which breakdown voltage between the N well regions 102a, 102b, and 102c and the P-type silicon substrate 100 is higher than the high voltage Vh. The impurity concentration of the P well regions 101 and the N well regions 102a, 102b, and 102c is set to a value at which the breakdown voltage between the P well regions 101 and the N well regions 102a, 102b, and 102c is higher than the high voltage Vh.

A field oxide film 103, high-concentration N-type diffusion regions 106a to 106e, and a high-concentration P-type diffusion region 107 are formed on the P well regions 101 and the N well regions 102a, 102b, and 102c. The field oxide film 103 is capable of being formed using, for example, a local oxidation of silicon (LOCOS) method.

An exemplary structure of the transistor MD1, which is a high breakdown-voltage NMOS transistor, will now be described. A gate electrode 105a is disposed on the P well region 101 and the N well region 102a, which are adjacent to each other, with a gate insulating film 104 disposed therebetween. A region where the P well region 101 is overlapped with the gate electrode 105a is a channel formation region.

The high-concentration N-type diffusion region 106a is the source of the transistor MD1 and the high-concentration P-type diffusion region 107 is the back gate electrode thereof. The N well region 102a includes a portion that extends below the gate electrode 105a as an electric-field relaxation region of the drain. The high-concentration N-type diffusion region 106b formed in the N well region 102a serves as the drain electrode of the transistor MD1.

In addition, the drain side of the gate electrode 105a has a structure in which the gate electrode 105a runs over the field oxide film 103 formed in the N well region 102a, that is, a so-called LOCOS offset structure. Accordingly, even if the voltage of the drain electrode is increased to the high voltage Vh when the transistor MD1 is in the off state, that is, the voltage of the gate electrode is the ground potential, the gate-drain breakdown voltage is capable of being ensured.

An exemplary structure of the anti-fuse element 11 will now be described. The anti-fuse element 11 has an upper electrode, a lower electrode, and an insulating layer between the upper electrode and the lower electrode. For example, an electrode 105b provided on the N well region 102b with the gate insulating film 104 interposed therebetween functions as the upper electrode of the anti-fuse element 11. A portion overlapped with the upper electrode, in plan view from a face of the semiconductor substrate 110, which is connected to the high-concentration N-type diffusion region 106c in the N well region 102b and on which the elements, such as the transistor MD1, are provided, functions as the lower electrode of the anti-fuse element 11. The plan view from the face on which the elements including the transistor MD1, the anti-fuse element 11, and the resistive element Rp are provided means, for example, the plan view from the face of the channel formation region of the transistor MD1.

Although the high-concentration N-type diffusion region 106c is formed only in an area that is not overlapped with the upper electrode in plan view in the N well region 102b in FIG. 2, the high-concentration N-type diffusion region 106c is not limited to this. For example, the high-concentration N-type diffusion region 106c may be formed on part of the portion that is overlapped with the upper electrode or the entire overlapping portion. When the high-concentration N-type diffusion region 106c is also formed in the portion that is overlapped with the upper electrode in plan view, the overlapping portion of the high-concentration N-type diffusion region 106c also functions as the lower electrode of the anti-fuse element 11.

Although the lower electrode of the anti-fuse element 11 is connected to the drain of the transistor MD1 in FIG. 2, the upper electrode may be connected to the drain of the transistor MD1 and the lower electrode may be connected to the high voltage Vh.

The gate insulating film 104 is capable of being formed in a process of forming the gate insulating film of the transistor MP1 and the transistor MN1 composing the logic circuit and may be formed of an oxide film. The electrodes 105a and 105b may be formed of polysilicon layers. The polysilicon layers, the high-concentration N-type diffusion regions 106a to 106c, and the high-concentration P-type diffusion region 107 are capable of being formed through the same process as the process of forming the elements, such as the transistor MP1 and the transistor MN1, forming a low breakdown-voltage logic circuit.

As described above, the anti-fuse element 11 is the anti-fuse element having the MOS structure and the transistors that control writing of information into the anti-fuse element 11 is the MOS transistors. Accordingly, the anti-fuse element and the transistors are capable of being formed through the same process. Consequently, it is possible to manufacture the semiconductor apparatus inexpensively with a fewer number of steps.

An insulating film including multiple contact portions 108 is provided on the high-concentration P-type diffusion region 107, the high-concentration N-type diffusion regions 106a to 106e, and the field oxide film 103. Conductive layers 109a to 109e are provided on the insulating film. The conductive layers 109a to 109e may be made of, for example, metal, such as aluminum. The manufacturing method, the material, and the structure of the conductive layers 109a to 109e, the respective electrodes, and wiring are not limited as long as the conductive layers 109a to 109e, the respective electrodes, and the wiring are electrically connected to each other.

Although the capacitive element the lower electrode and the upper electrode of which are formed of the N well regions and the polysilicon layers is exemplified as the anti-fuse element 11 in FIG. 2, the anti-fuse element 11 is not limited to this structure. For example, the anti-fuse element 11 may be a capacitive element using a PMOS transistor. One of the upper electrode and the lower electrode of the anti-fuse element 11 functions as one terminal and the other of the upper electrode and the lower electrode thereof functions as the other terminal.

The resistive element Rp has the N well region 102c, which is a semiconductor region in the semiconductor substrate 110, and is connected to the conductive layers 109d and 109e with the high-concentration N-type diffusion region 106d and 106e interposed therebetween, respectively. The resistive element Rp is not limited to this structure. For example, a resistor body formed of a conductive layer or a polysilicon resistor body may be used as the resistive element Rp.

The insulating film is an insulating layer formed on the semiconductor substrate 110 so as to cover the transistor MD1, the resistive element Rp, and so on and is made of, for example, silicon oxide. The insulating layer is not limited to this and may be made of silicon nitride or silicon carbide. Alternatively, the insulating layer may be a multilayer body or a mixture layer.

The conductive layer 109a is connected to the source and the back gate of the transistor MD1 with the contact portions 108 interposed therebetween. The ground potential is applied to the conductive layer 109a. The conductive layer 109b is connected to the drain electrode of the transistor MD1 and the lower electrode of the anti-fuse element 11 with the contact portions 108 interposed therebetween. The conductive layer 109c is connected to the upper electrode of the anti-fuse element 11 with the contact portion 108 interposed therebetween and is connected to the first terminal VH at a portion not illustrated. The high voltage Vh is applied to the conductive layer 109c through the first terminal VH in writing. The conductive layer 109d is connected to the conductive layer 109c (not illustrated) and the conductive layer 109e is connected to the conductive layer 109b (not illustrated).

Third Embodiment

An example is illustrated in a third embodiment in which multiple memory units 10 are provided. The memory unit 10 is described in the above embodiments.

Figure 3:
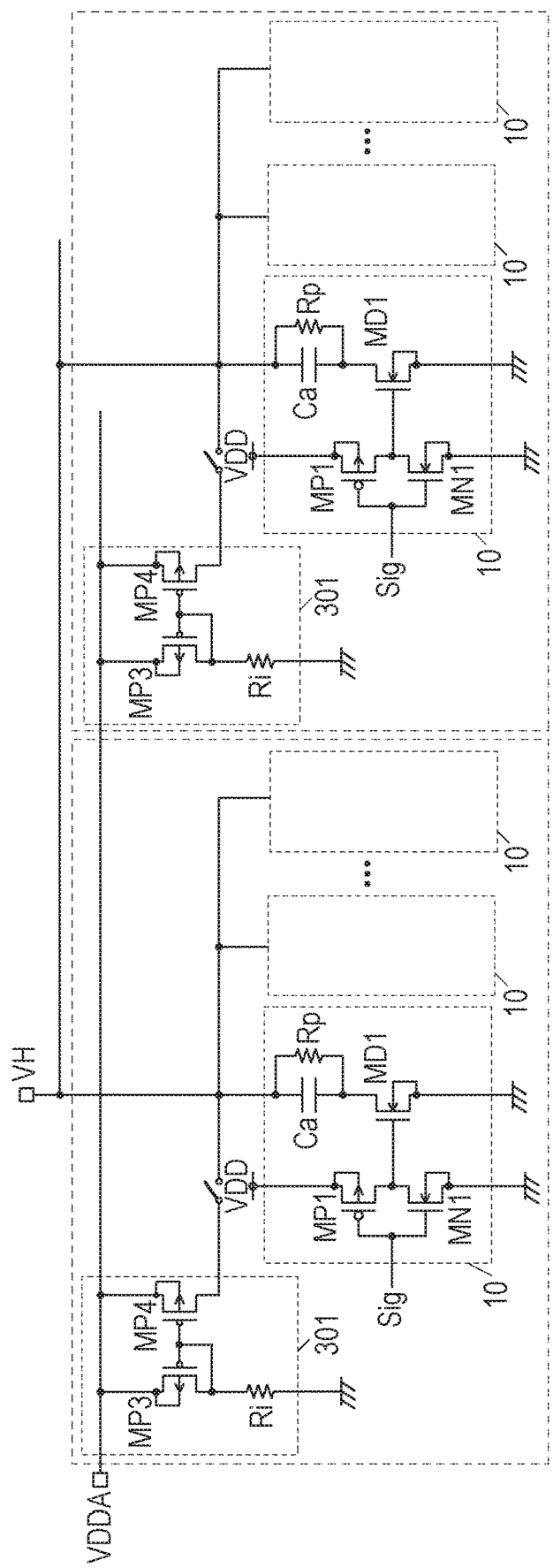
FIG. 3 is a circuit diagram illustrating part of an exemplary circuit configuration of a semiconductor apparatus according to a third embodiment.

FIG. 3 is a circuit diagram illustrating an exemplary circuit configuration of a semiconductor apparatus according to the third embodiment and illustrates a state before information is written into the anti-fuse element 11. Referring to FIG. 3, the semiconductor apparatus includes the multiple memory units 10 each including the capacitive element Ca, which is the anti-fuse element 11, the parallel resistive element Rp, and the transistor MD1. In addition, the semiconductor apparatus includes multiple current supply units 301. Here, the current generation resistor Ri, which is described in the first embodiment and which determines the amount of current from the current supply units 301 so as to correct the variation in the resistance of the parallel resistive element Rp, has the same configuration as that of the parallel resistive element Rp.

If the position on the substrate of the parallel resistive element Rp is greatly apart from that of the current generation resistor Ri, the difference in the resistance value between the current generation resistor Ri and the parallel resistive element Rp formed at a position apart from the current generation resistor Ri, which is caused by the manufacturing variation, is increased. In addition, when the temperature is varied with the position, the difference in the resistance value, which is caused by the temperature variation, also occurs. These differences lead a reduction in the reading accuracy.

In the third embodiment, in the arrangement of the multiple anti-fuse elements 11, the multiple (two in FIG. 3) current supply units 301 used in reading are provided and the reading is performed using the current supply unit 301 having a shorter connection line from the parallel resistive element Rp. This enables the difference in the resistance value between the parallel resistive element Rp and the current generation resistor Ri, which is caused by the manufacturing variation or the temperature variation, to be reduced to improve the reading accuracy.

Although the example is described in the third embodiment in which the semiconductor apparatus includes the two current supply units 301 for description, the semiconductor apparatus may include the current supply units 301 of a larger number depending on the variation that is permitted. With the configuration of the third embodiment, it is possible to suppress a reduction in the reading accuracy also in the semiconductor apparatus including the multiple memory units 10 each including the anti-fuse element 11.

Fourth Embodiment

An example is illustrated in a fourth embodiment in which the semiconductor apparatus is applied to a recording apparatus as an example of application of the semiconductor apparatus described in any of the above embodiments.

Figure 4:
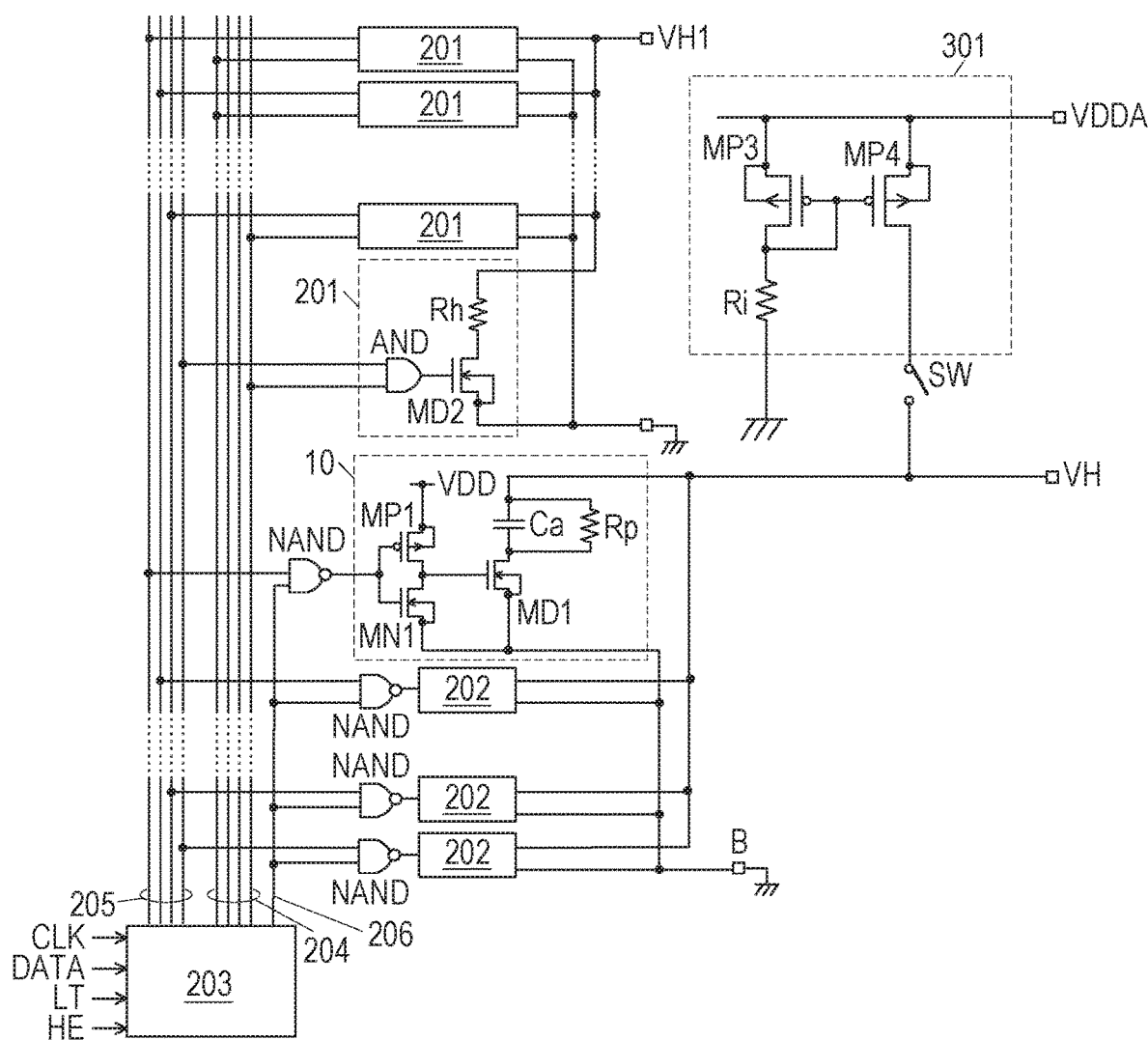
FIG. 4 illustrates an exemplary circuit configuration of a liquid discharge head substrate according to a fourth embodiment.

FIG. 4 illustrates an exemplary circuit configuration of a liquid discharge head substrate including the semiconductor apparatus (the memory unit 10) described in any of the first to third embodiments. The liquid discharge head substrate includes the memory unit 10, logic circuits NAND, and recording units 201.

The memory unit 10 includes the inverter composed of the transistor MP1 and the transistor MN1, the transistor MD1, the anti-fuse element 11, and the resistive element Rp. Each recording unit 201 includes a heater Rh (an electrothermal transducer), which a discharge element, and a driving unit (for example, a transistor MD2 and a logical product circuit AND) which drives the heater Rh. Driving the heater Rh, that is, electrifying the heater Rh to generate heat causes a recording agent to be discharged to enable recording.

A control circuit 203 may be composed of, for example, a shift register or a latch circuit, which is not illustrated. A clock signal CLK, an image data signal DATA, a latch signal LT, and a heater control signal HE may be input into the control circuit 203 via, for example, a host personal computer (PC) (not illustrated). The power supply voltage VDD (for example, 3 V to 5 V) is supplied to the logical product circuit AND, the logic circuits NAND, and the control circuit 203 as first power supply voltage, which is the power supply voltage for logics. The recording units 201 and the memory unit 10 are electrically connected to the control circuit 203.

The control circuit 203 may perform time division driving in which the operations of the recording units 201 are controlled for, for example, each of m-number groups each including the recording units 201 of an n-number, to drive the heater Rh. The time division driving may be performed in response to block selection signals 204 of an m-number bit and time division selection signals 205 of an n-number bit, which are output from the control circuit 203.

The corresponding block selection signal 204 and the corresponding time division selection signal 205 are input into the logical product circuit AND. In response to input of the block selection signal 204 and the time division selection signal 205, the transistor MD2 is set to a conductive state to drive the heater Rh connected in series to the transistor MD2. Here, second power supply voltage VH1 (for example, 24 V) is supplied to the recording units 201 as the power supply voltage for driving the heater and the recording units 201 are grounded.

A control signal 206 and the time division selection signals 205 are input into the logic circuits NAND. In response to input of the control signal 206 and the time division selection signals 205, a signal is supplied from the inverter to the transistor MD1 to switch the transistor MD1 between the conductive state and a non-conductive state. Third power supply voltage for writing information into the anti-fuse element 11 is supplied to the memory unit 10 and the memory unit 10 is grounded.

The current supply unit 301 is connected to the first terminal VH with the switch SW interposed therebetween. The sources and the back gates of the transistors MP3 and MP4 are connected to, for example, the analog power supply VDDA, and the gates of the transistors MP3 and MP4 are connected to each other and are connected to the drain of the transistor MP3. The drain of the transistor MP3 is connected to one end of the current generation resistor Ri and the other end of the current generation resistor Ri is grounded. The drain of the transistor MP4 is connected to the switch SW.

An example will now be described with reference to FIGS. 5A to 5D in which the liquid discharge head substrate is mounted in a liquid discharge apparatus. A liquid discharge apparatus adopting an inkjet recording method is exemplified here. However, the liquid discharge apparatus is not limited to this mode and, for example, a liquid discharge apparatus adopting a melting or sublimation heat transfer method is also applied. The liquid discharge apparatus may be a single-function printer having, for example, only a recording function or may be a multi-function printer having multiple functions including, for example, the recording function, a FAX function, and a scanner function. The liquid discharge apparatus may be a manufacturing apparatus for manufacturing, for example, a color filter, an electronic device, an optical device, or a micro structure using a certain recording method.

The "recording" may include not only a case in which, for example, an image, a design, a pattern, or a structure, which is visualized so as to be perceived by human beings, is formed on a recording medium but also a case in which a medium is processed. The "recording medium" may include not only a sheet of paper used in a general liquid discharge apparatus but also a material, such as cloth, a plastic film, a metal plate, glass, ceramics, resin, wood, or leather, on which the recording agent is capable of being applied. The "recording agent" may include not only liquid, such as ink, which is applied on the recording medium to be usable for the formation of the image, the design, or the pattern or the processing of the recording medium but also liquid usable for processing of the recording agent (for example, solidification or insolubilization of a coloring material contained in the recording agent).

Figure 5A:
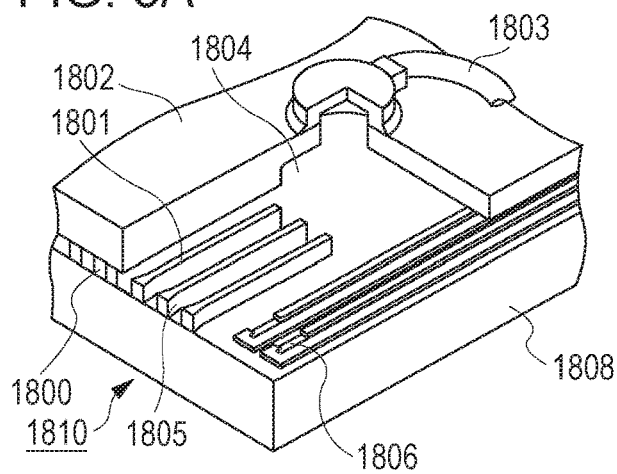
FIGS. 5A to 5D are diagrams for describing examples of a liquid discharge head and a liquid discharge apparatus.

FIG. 5A illustrates a major portion of a liquid discharge head 1810. The liquid discharge head 1810 includes an ink supply port 1803. The heater Rh in the above embodiments is represented as a heat generating portion 1806. As illustrated in FIG. 5A, in a base 1808, a passage wall member 1801 for forming liquid passages 1805 communicated with multiple discharge ports 1800 is combined with a top panel 1802 including the ink supply port 1803 to form the liquid discharge head 1810. In this case, ink injected from the ink supply port 1803 is stored in an internal common liquid room 1804 and is supplied from the common liquid room 1804 to the respective liquid passages 1805. The base 1808 and the heat generating portion 1806 are driven in the above state to cause the ink to be discharged from the discharge ports 1800.

Figure 5B:
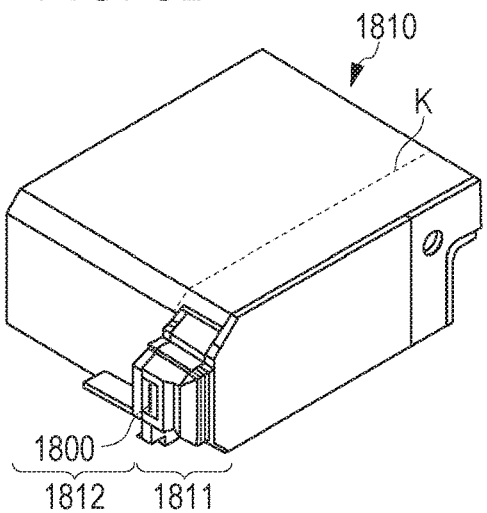
Figure 5C:
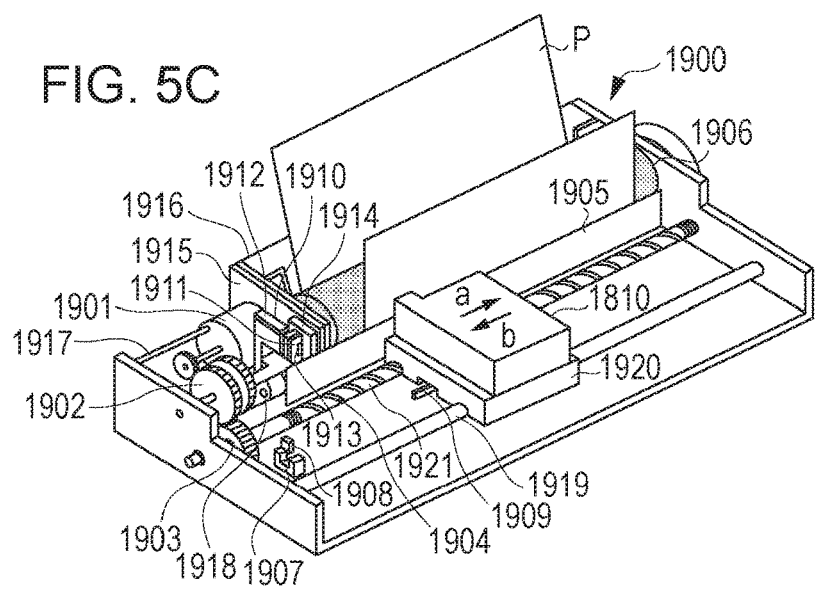

FIG. 5B illustrates the entire configuration of the liquid discharge head 1810 described above. The liquid discharge head 1810 includes the multiple discharge ports 1800 described above, a recording portion 1811 including the liquid discharge head substrate of the first or second embodiment, and an ink container 1812 that holds the ink to be supplied to the recording portion 1811. The ink container 1812 is provided so as to be removable from the recording portion 1811 along a boundary line K. An electrical contact (not illustrated) for receiving an electrical signal from a carriage side when the liquid discharge head 1810 is mounted in a liquid discharge apparatus illustrated in FIG. 5C is provided on the liquid discharge head 1810. The heat generating portion 1806 generates heat based on the electrical signal. A fibrous or porous ink absorber for holding the ink is provided in the ink container 1812 and the ink is held by the ink absorber.

The liquid discharge head 1810 illustrated in FIG. 5B is mounted on the main body of the inkjet liquid discharge apparatus and a signal supplied from the main body to the liquid discharge head 1810 is controlled. With such a configuration, it is possible to provide the inkjet liquid discharge apparatus capable of realizing high-speed recording and high image quality recording. An inkjet liquid discharge apparatus using the liquid discharge head 1810 will now be described.

FIG. 5C is an external perspective view illustrating an inkjet liquid discharge apparatus 1900 according to an embodiment. Referring to FIG. 5C, the liquid discharge head 1810 is mounted on a carriage 1920 engaged with a spiral groove 1921 on a lead screw 1904 that interlocks with forward and reverse rotation of a driving motor 1901 to rotate via driving-force transmission gears 1902 and 1903. With such a configuration, the liquid discharge head 1810 is capable of reciprocating in the direction of an arrow a or an arrow b along a guide 1919 with the carriage 1920 using the driving force of the driving motor 1901. A paper holding plate 1905 for recording paper P that is conveyed on a platen 1906 by a recording medium feeding unit (not illustrated) pushes the recording paper P against the platen 1906 along the direction in which the carriage moves.

Photo couplers 1907 and 1908 are a home position detecting unit that confirms the presence of a lever 1909 provided in the carriage 1920 in an area where the photo couplers 1907 and 1908 are provided to perform, for example, switching of the rotation direction of the driving motor 1901. A supporting member 1910 supports a cap member 1911 that caps the entire liquid discharge head 1810. A suction unit 1912 sucks the inside of the cap member 1911 to clean the liquid discharge head 1810 via an opening 1913 in the cap. A moving member 1915 enables a cleaning blade 1914 to move in the front-back direction. The cleaning blade 1914 and the moving member 1915 are supported by a main body supporting plate 1916. The cleaning blade 1914 may not be used and a known cleaning blade may be applied to the fourth embodiment. A lever 1917 is provided to start the suction in the cleaning and is moved with movement of a cam 1918 engaged with the carriage 1920. Movement of the driving force from the driving motor 1901 is controlled by a known transmission unit, such as clutch switching. A recording controller (not illustrated) that supplies a signal to the heat generating portion 1806 provided in the liquid discharge head 1810 to control driving of each mechanism, such as the driving motor 1901, is provided at the main body side of the apparatus.

In the inkjet liquid discharge apparatus 1900 having the above configuration, the recording is performed on the recording paper P conveyed on the platen 1906 by the recording medium feeding unit while the liquid discharge head 1810 is reciprocating across the entire width of the recording paper P. Since the liquid discharge head 1810 uses the liquid discharge head substrate of the fourth embodiment, it is possible to realize both improvement of the discharge precision of the ink and driving at low voltage.

Figure 5D:
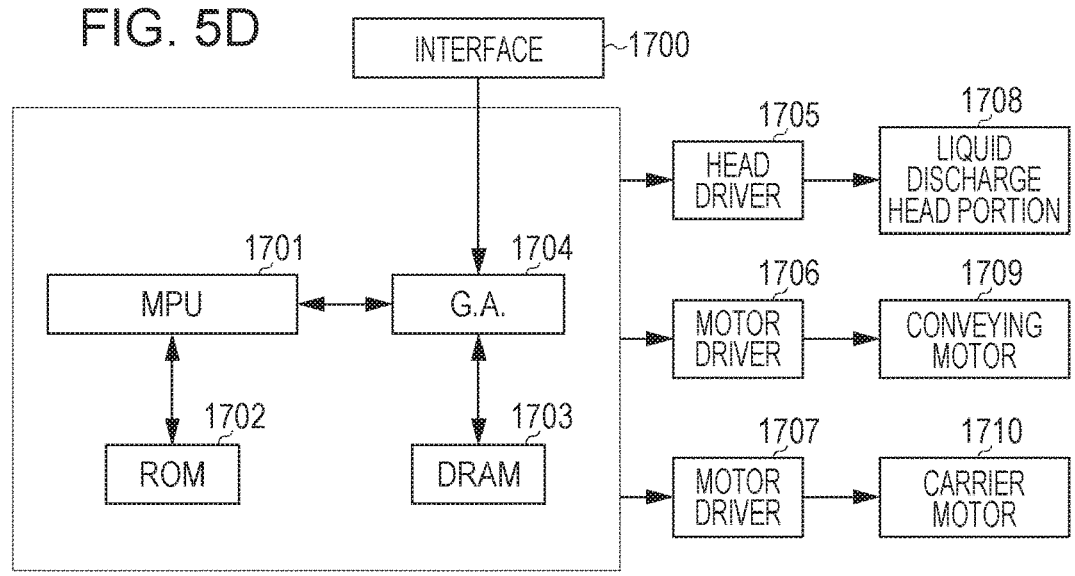

An exemplary configuration of a control circuit to perform the recording control of the apparatus described above will now be described. FIG. 5D is a block diagram illustrating an exemplary configuration of a control circuit of the inkjet liquid discharge apparatus 1900. The control circuit includes an interface 1700 into which a recording signal is input, a micro-processing unit (MPU) 1701, a program read only memory (ROM) 1702, a dynamic random access memory (RAM) 1703, and a gate array 1704. The program ROM 1702 stores control programs executed by the MPU 1701. The dynamic RAM 1703 stores the recording signal and a variety of data, such as recording data, to be supplied to the head. The gate array 1704 controls supply of the recording data to a liquid discharge head portion 1708. The gate array 1704 also controls data transfer between the interface 1700, the MPU 1701, and the dynamic RAM 1703. The control circuit also includes a carrier motor 1710 for conveying the liquid discharge head portion 1708 and a conveying motor 1709 for conveying the recording paper. The control circuit further includes a head driver 1705 that drives the liquid discharge head portion 1708 and motor drivers 1706 and 1707 for driving the conveying motor 1709 and the carrier motor 1710, respectively.

An operation in the above configuration of the control circuit will now be described. Upon input of the recording signal into the interface 1700, the recording signal is converted into printing recording data between the gate array 1704 and the MPU 1701. The motor drivers 1706 and 1707 are driven and the liquid discharge head is also driven in accordance with the recording data supplied to the head driver 1705 to perform printing.

The recording apparatus may be used as an apparatus that has three-dimensional data and that generates a three-dimensional image.

Figure 6:
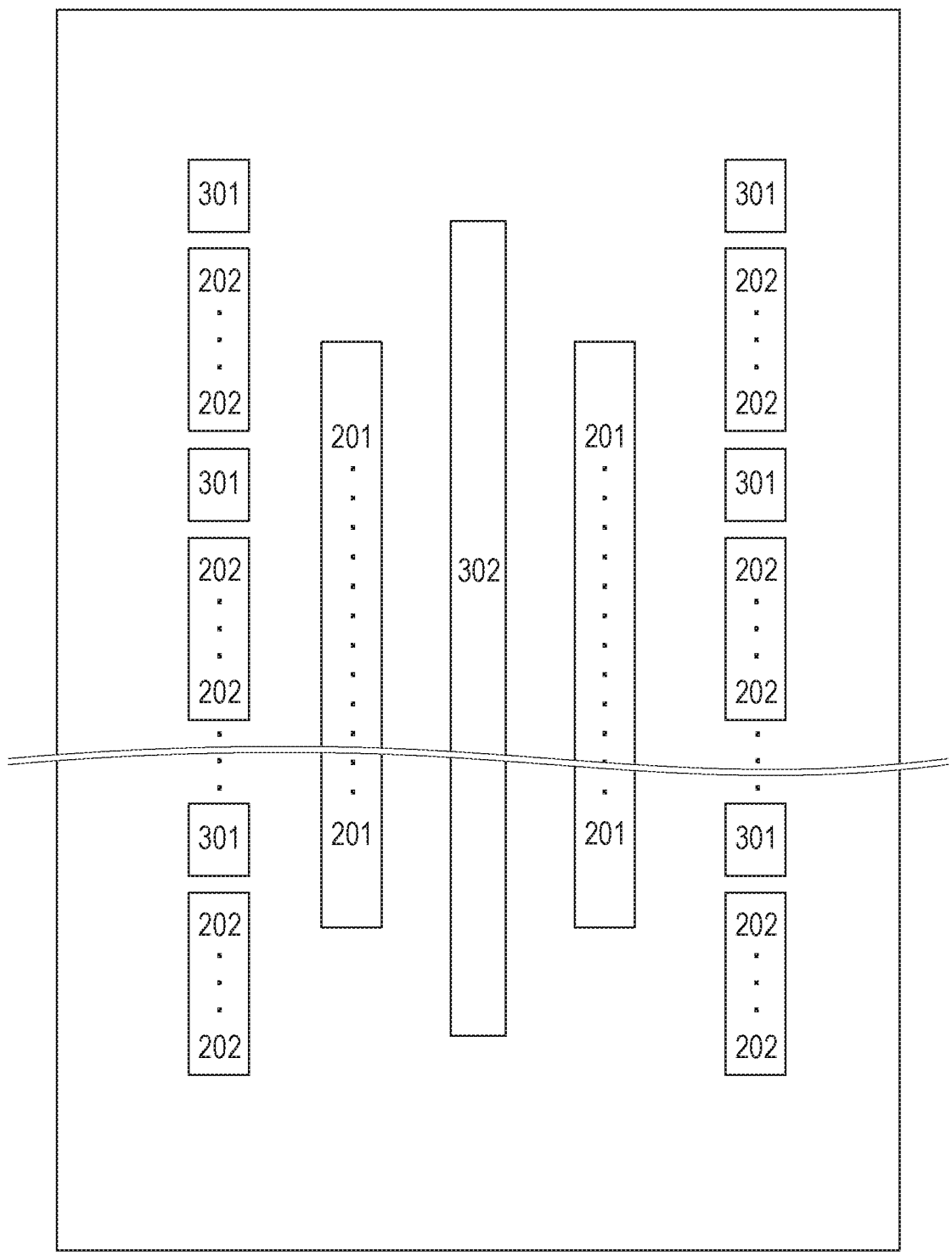
FIG. 6 is a conceptual diagram for describing an example of the liquid discharge head.

FIG. 6 is a diagram illustrating an example of how the circuit components are arranged in the liquid discharge head substrate illustrated in FIG. 4. An ink supply port 302, which is a hole through which the ink flows, is disposed in a central portion of the substrate and the multiple recording units 201 are disposed on both sides of the ink supply port 302. Multiple memory units 202 are disposed in end portions along the long sides of the substrate. The multiple current supply units 301 are disposed on the substrate.

Since the recording units generate heat, the distribution of the temperature in the substrate may be varied depending on recorded information. In addition, since the ink supply port 302 has a low thermal conductivity to the substrate, the difference in temperature tends to be increased in the left and right direction with respect to the ink supply port. In order to improve the recording speed of the recording apparatus, it is effective to increase the number of the recording units 201. However, since the longitudinal length is increased in this case, the variation in the resistance of the parallel resistive element Rp is increased in the substrate. The disposition of the multiple current supply units 301 as in the example in FIG. 6 enables a reduction in the reading accuracy, which is caused by the variation in the resistance of the parallel resistive element Rp, to be suppressed also in the above case.

As described above, the application of the semiconductor apparatus of the first or second embodiment to the liquid discharge apparatus enables the reading error from the anti-fuse element 11, which is a memory element, to be reduced. The same applies to a case in which any of the semiconductor apparatuses described in the fourth to sixth embodiments is applied to the liquid discharge apparatus. Also in this case, it is possible to suppress a reduction in the reading accuracy from the anti-fuse element 11.

Fifth Embodiment

An example will be described in a fifth embodiment in which the adjusting unit includes a resistive element Rr configured so as to cancel the variation (shift) in the resistance of the resistive element Rp using the partial pressure.

Figure 7:
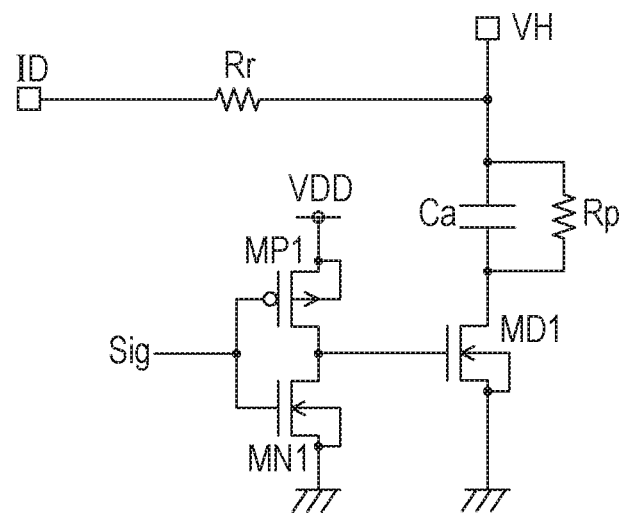
FIG. 7 is a circuit diagram illustrating an exemplary circuit configuration of a semiconductor apparatus according to a fifth embodiment.

FIG. 7 is a circuit diagram illustrating an exemplary circuit configuration of a semiconductor apparatus according to the fifth embodiment and illustrates a state before information is written into the anti-fuse element 11. In the fifth embodiment, the semiconductor apparatus includes the resistive element Rr connected between a power supply terminal ID to which current is externally supplied and the first terminal VH as the adjusting unit, which changes reading conditions in accordance with the resistance of the parallel resistive element Rp in reading. A description of the same components, the same functions, and the same advantages as those in the first embodiment will be omitted herein.

Referring to FIG. 7, the first terminal VH is connected to the power supply terminal ID with the resistive element Rr for reading adjustment (hereinafter referred to as the reading adjustment resistive element Rr) interposed therebetween. The reading adjustment resistive element Rr has the same configuration as that of the parallel resistive element Rp, like the current generation resistor Ri of the first embodiment, and is the diffused resistor here. In the reading, voltage Vid is applied to the power supply terminal ID and the voltage VHout at the first terminal VH is externally read out. The reading voltage VHout before information is written into the anti-fuse element 11 is represented by the flowing equation because the on resistance of the transistor MD1 is made much smaller than the resistance of the parallel resistive element Rp.

$$VHout = Vid \times Rp/(Rr+Rp) \qquad (2)$$

Since the reading adjustment resistive element Rr and the parallel resistive element Rp are formed through the same process (have the same configuration), the reading adjustment resistive element Rr and the parallel resistive element Rp have similar shifts even when the resistance values of the reading adjustment resistive element Rr and the parallel resistive element Rp are shifted from the design value or the theoretical value. Accordingly, since the variations are offset if the parallel resistive element Rp and the reading adjustment resistive element Rr are in the same temperature environment even when the resistance values of the parallel resistive element Rp and the reading adjustment resistive element Rr are varied (shifted) according to the above equation, the voltage VHout does not depend on the variations in the resistance values of the parallel resistive element Rp and the reading adjustment resistive element Rr. Consequently, in the reading of information from the anti-fuse element 11, it is possible to suppress or eliminate the influence of the manufacturing variation or the temperature variation.

Although the variations in the characteristics of the transistor MP3, the transistor MP4, and the transistor MD1 practically have effects on the reading of information from the anti-fuse element 11, the reading errors are capable of being greatly reduced because the amounts of variations in the characteristics of the transistor MP3, the transistor MP4, and the transistor MD1 are very smaller than the amount of variation in the resistance of the diffused resistor.

Although the same diffused resistor is used for the parallel resistive element Rp and the reading adjustment resistive element Rr and the parallel resistive element Rp and the reading adjustment resistive element Rr are configured so as to have the same width and the same length in order to reduce the relative variation of the parallel resistive element Rp and the reading adjustment resistive element Rr in the fifth embodiment, it is sufficient to reduce the variation in the reading voltage and the configurations of the parallel resistive element Rp and the reading adjustment resistive element Rr are not limited to the above ones.

Sixth Embodiment

An example will be described in a sixth embodiment in which the adjusting unit is a current supply unit that is provided on the same substrate as that of the resistive element Rp and that includes a transistor. Specifically, an example is described in which the current supply unit is configured so as to be capable of performing the accurate reading regardless of the variation in the resistance of the resistive element Rp through control of the operation conditions of the transistor MD1.

Figure 8:
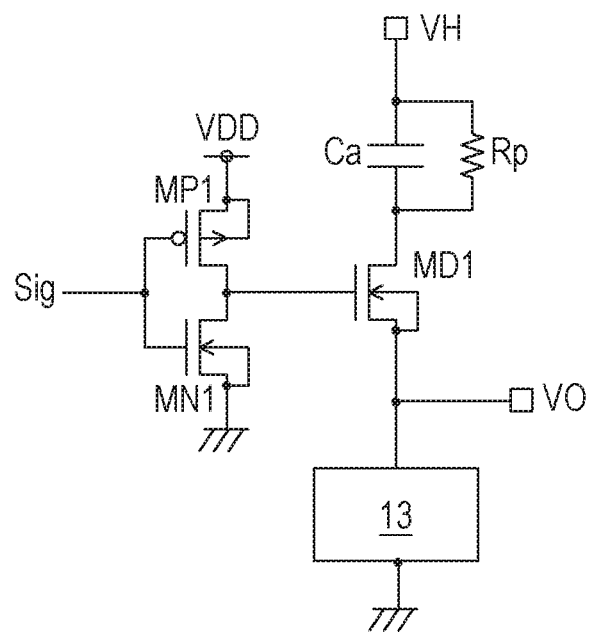
FIG. 8 is a circuit diagram illustrating an exemplary circuit configuration of a semiconductor apparatus according to a sixth embodiment.

FIG. 8 is a circuit diagram illustrating an exemplary circuit configuration of a semiconductor apparatus according to the sixth embodiment. In the sixth embodiment, the semiconductor apparatus includes the current supply unit including the transistor as the adjusting unit, which functions so as to reduce the variation (including the difference from the design value) in the resistance of the parallel resistive element Rp in reading. The current supply unit in the sixth embodiment may be a variable current source 13 connected to the transistor MD1. FIG. 8 illustrates a state before information is written into the anti-fuse element 11. A description of the same components, the same functions, and the same advantages as those in the first embodiment will be omitted herein.

In the sixth embodiment, the voltage at an output terminal VO between the variable current source 13 and the transistor MD1 is measured to acquire information indicating whether information is written into the anti-fuse element 11. Specifically, the semiconductor apparatus is configured so as to enable the determination of whether information is written into the anti-fuse element 11 from the difference in the voltage at the output terminal VO, which is based on whether the transistor MD1 operates in a linear region or a saturation region.

Referring to FIG. 8, the variable current source 13 is connected to the transistor MD1 with the output terminal VO interposed therebetween. Specifically, the source and the back gate of the transistor MD1 are connected to the output terminal VO and the output terminal VO is connected to the variable current source 13.

First, a writing operation will now be described. In writing of information into the anti-fuse element 11, the low-level signal is input as the control signal Sig to set the transistor MD1 to the on state. In addition, the high voltage Vh (for example, 24 V) is applied to the first terminal VH to set the current value set in the variable current source 13 to IA (for example, 2.4 mA).

As a result, the high voltage Vh is applied to the gate insulating film composing the anti-fuse element 11. Accordingly, the gate insulating film of the capacitive element Ca, which is the anti-fuse element 11, is subjected to the dielectric breakdown and information is written into the anti-fuse element 11.

Next, a reading operation will now be described. The low-level signal is input as the control signal Sig corresponding to the anti-fuse element 11 from which information is to be read out to apply the power supply voltage VDD to the gate of the transistor MD1, thereby setting the transistor MD1 to the on state. In addition, the voltage from the power supply voltage VDD or the analog power supply VDDA is applied to the first terminal VH to set the current value set in the variable current source 13 to IB (for example, 100 uA).

In the sixth embodiment, the transistor MD1 operates in the saturation region when information is written into the anti-fuse element 11 and the transistor MD1 operates in the linear region when information is not written into the anti-fuse element 11. The voltage at the first terminal VH, the voltage of the gate of the transistor MD1, the current value set in the variable current source 13, and so on in the reading are set so as to meet the above condition.

The transistor MD1 operates in the saturation region if source-drain voltage Vds is higher than or equal to a value resulting from subtraction of a threshold value Vth from gate-drain voltage Vgs. In other words, the transistor MD1 operates in the saturation region if the following equation in the saturation region is met:

$$Vds \geq Vgs - Vth \quad (3)$$

The transistor MD1 operates in the linear region if the source-drain voltage Vds is lower than or equal to the value resulting from subtraction of the threshold value Vth from the gate-drain voltage Vgs. In other words, the transistor MD1 operates in the linear region if the following equation in the linear region is met:

$$Vds \leq Vgs - Vth \quad (4)$$

The voltage of the gate of the transistor MD1 is controlled based on the output from the logic circuit (inverter) composed of the transistor MP1 and the transistor MN1. In other words, in the example in FIG. 8, the power supply voltage VDD of the logic circuit is supplied to the gate of the transistor MD1. In contrast, the voltage of the drain of the transistor MD1 is determined by the voltage drops of the anti-fuse element 11 and the resistive element Rp. Accordingly, in the sixth embodiment, the semiconductor apparatus is configured so as to be capable of selecting the case in which the transistor MD1 operates in the saturation region and the case in which the transistor MD1 operates in the linear region depending on the writing state of information, in terms of the voltage of the drain of the transistor MD1. Basically, the transistor MD1 is likely to operate in the saturation region if the voltage drop in the resistive element Rp is small. The transistor MD1 is likely to operate in the linear region if the voltage drop in the resistive element Rp is large.

The reading operation will now be described, taking a case in which the voltage at the first terminal VH is the power supply voltage VDD as an example.

Since the resistance value of the anti-fuse element 11 is sufficiently lower than that of the resistive element Rp when information is written into the anti-fuse element 11, the resistance value of the anti-fuse element 11 is a dominant factor on the voltage drop between the first terminal VH and the drain of the transistor MD1. The amount of voltage drop is controlled by the resistance value of the anti-fuse element 11 and the current value IB set in the variable current source 13. Accordingly, the current value IB set in the variable current source 13 is determined so that the transistor MD1 meets the above equation in the saturation region even if the resistance of the anti-fuse element 11 has a maximum value in consideration of the voltage drop in the anti-fuse element 11 and the variation in the resistance of the anti-fuse element 11 after information is written into the anti-fuse element 11.

Through the above operation, it is possible to provide the semiconductor apparatus in which the transistor MD1 operates in the saturation region when information is written into the anti-fuse element 11.

In contrast, when the anti-fuse element 11 is in the state before information is written into the anti-fuse element 11, that is, when the anti-fuse element 11 is the capacitive element Ca, the resistance of the resistive element Rp is sufficiently lower than the resistance of the anti-fuse element 11. In this case, the resistance value of the resistive element Rp is a dominant factor on the voltage drop between the first terminal VH and the drain of the transistor MD1.

When it is supposed that the current value IB is set, determining the resistance value of the resistive element Rp so that the transistor MD1 meets the equation in the linear region enables the transistor MD1 to operate in the linear region. Here, it is possible to cause the transistor MD1 to stably operate in the linear region by considering a case in which the resistance of the resistive element Rp has a minimum value in the variation in the resistance of the resistive element Rp.

Even when the resistive element Rp has the manufacturing variation or the temperature variation (the shift from the design value), whether the transistor MD1 operates in the linear region or operates in the saturation region is determined based on whether information is written into the anti-fuse element 11.

Since the transistor MD1 functions as a source follower when the transistor MD1 operates in the saturation region, the voltage at the output terminal VO has a value corresponding to the voltage of the gate of the transistor MD1. Since this voltage value is capable of being arbitrarily set, the voltage value is capable of being set to a value higher than that when the transistor MD1 operates in the linear region. When the transistor MD1 operates in the linear region, the voltage at the output terminal VO is decreased so that the transistor MD1 and a transistor MN2 used for the variable current source 13 are set at certain operating points. The certain operating points means a state in which the gate-source voltage and the drain-source voltage of each transistor are determined so that the drain current output from the transistor MN2 is made equal to the drain current output from the transistor MD1. Here, the voltage at the output terminal VO has a value resulting from voltage division of the voltage at the second terminal among 1) the combined resistance of the resistance values of the resistive element Rp and the anti-fuse element 11, 2) the source-drain resistance of the transistor MD1, and 3) the source-drain resistance of the transistor MN2.

Accordingly, a reference voltage is set between the voltage at the output terminal VO when the transistor MD1 operates in the saturation region and the voltage at the output terminal VO when the transistor MD1 operates in the linear region. In this case, comparison between the voltage at the output terminal VO and the reference voltage enables the determination of whether the transistor MD1 operates in the saturation region or operates in the linear region. The voltage at the output terminal VO is not affected by the variation in the resistance of the resistive element Rp.

Consequently, in the semiconductor apparatus of the sixth embodiment, whether information is written into the anti-fuse element 11 is capable of being accurately read out based on the resistive element Rp regardless of any manufacturing variation or any temperature variation (any shift from the design value).

Although the threshold value Vth of the transistor MD1 has the manufacturing variation and so on, the manufacturing variation and so on of the threshold value Vth of the transistor MD1 is sufficiently smaller than the variations (shifts) in the resistances of the anti-fuse element 11 and the resistive element Rp after information is written into the anti-fuse element 11. Accordingly, it is possible to accurately read out the writing state of the anti-fuse element 11 by considering the variations (shifts) in the resistances of the anti-fuse element 11 and the resistive element Rp after information is writing into the anti-fuse element 11.

Seventh Embodiment

Figure 9:
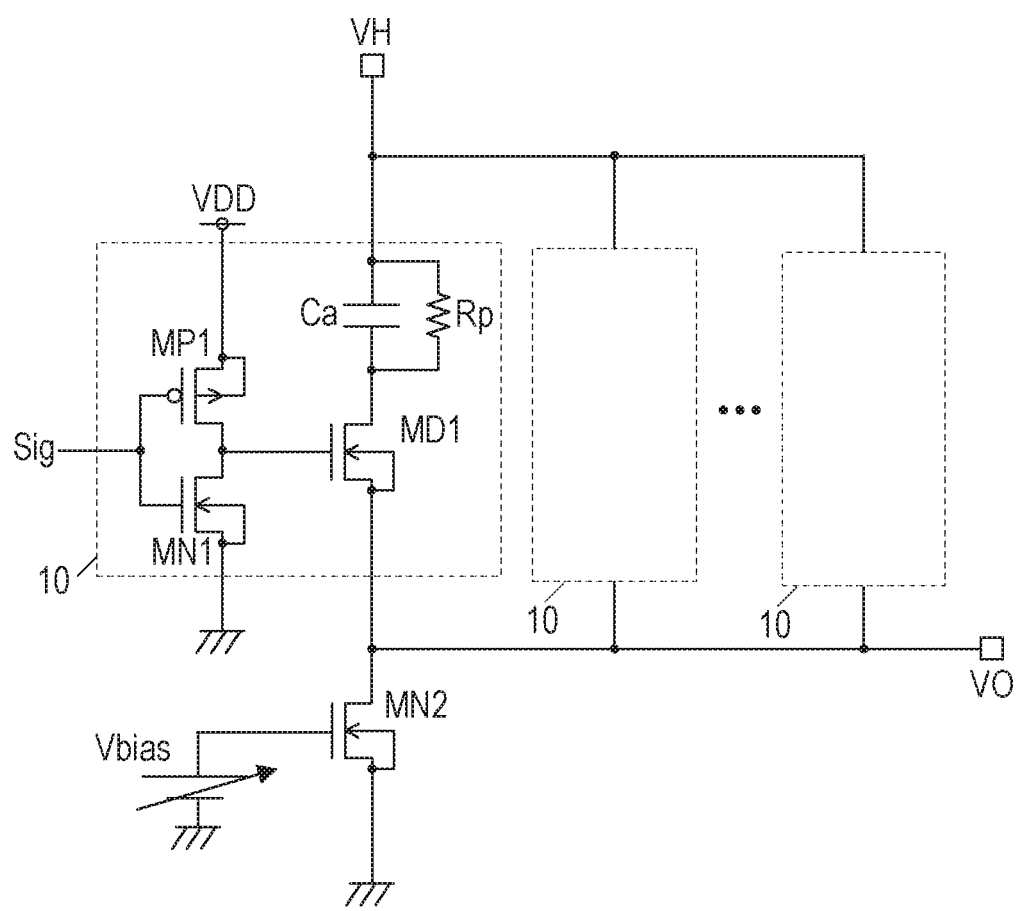
FIG. 9 is a circuit diagram illustrating an exemplary circuit configuration of a semiconductor apparatus according to a seventh embodiment.

A semiconductor apparatus according to a seventh embodiment includes the multiple memory units 10 each corresponding to one bit. The memory unit 10 is described in the first embodiment. FIG. 9 is a circuit diagram illustrating an exemplary circuit configuration of the semiconductor apparatus according to the seventh embodiment. A description of the same components, the same functions, and the same advantages as those in the other embodiments will be omitted herein.

Referring to FIG. 9, the first terminal VH and the output terminal VO are commonly connected to the respective memory units 10. An example is described in FIG. 9 in which the variable current source 13 is composed of an NMOS transistor in which the gate voltage is controlled with a variable voltage source.

First, a writing operation will now be described.

When information is concurrently written into the multiple anti-fuse elements 11, the power supply voltage VDD is applied to the gates of the corresponding transistors MD1 through the multiple logic circuits (not illustrated) to set the transistors MD1 to the on state. In addition, the high voltage Vh (for example, 24 V) is applied to the first terminal VH and voltage Vbias is set so that the transistor MN2 is capable of sinking current of a certain amount or more. The voltage Vbias is more suitably connected to the power supply of the power supply voltage VDD or the analog power supply VDDA in order to supply the sink current sufficient to write information into the multiple anti-fuse elements 11. If the sink current runs short even in this state, the gates of the transistors MD1 of the memory units 10 into which information is to be written is driven in time division to individually set the transistors MD1 to the on state.

In contrast, the transistors MD1 corresponding to the anti-fuse elements 11 into which information is not to be written are set to the off state through the multiple logic circuits. The presence of the transistors MD1 prevents the voltage at the output terminal VO during the writing operation from exceeding the power supply voltage of the logic circuits (not illustrated). Since the transistor MN2 used for the variable current source 13 may not be the high breakdown-voltage transistor (for example, double diffused MOS (DMOS) transistor) the drain of which is capable of withstanding the high breakdown-voltage, the mounting area is capable of being reduced.

Next, a reading operation will now be described.

The reading is performed for each memory unit 10 in the example in FIG. 9. For example, when information is not written into the anti-fuse element 11 from which information is to be read out (when the anti-fuse element 11 is the capacitive element Ca), the power supply voltage VDD is applied to the gate of the corresponding transistor MD1 through the logic circuit (not illustrated) to set the transistor MD1 to the on state. At this time, for example, the ground potential is applied to the gates of the transistors MD1 other than the transistor MD1 corresponding to the memory element into which information is to be written to set the multiple transistors MD1 to the off state.

In addition, the power supply voltage VDD or the analog power supply VDDA is connected to the output terminal VO and the voltage Vbias is set so that the variable current source 13 is capable of sinking the current of the certain amount. The information about the writing of information into the anti-fuse element 11 in each memory unit 10 is subsequently capable of being read out through the same operation as the reading operation described in the fifth embodiment.

In the seventh embodiment, the output voltage values based on whether information is written into the anti-fuse elements 11 are capable of being differentiated depending on whether the transistors MD1 operate in the linear region or operate in the saturation region. Accordingly, it is possible to effectively suppress a reduction in the reading accuracy about the determination of whether information is written into the anti-fuse elements 11 even if the resistance value of the parallel resistive element Rp is varied (shifted from the set value) for each memory unit 10 due to the manufacturing variation or the temperature variation.

While the disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-068692 filed Mar. 30, 2017, which is hereby incorporated by reference herein in its entirety.

What is claimed is:

1. A semiconductor apparatus comprising:
    a semiconductor substrate;
    a transistor provided on the semiconductor substrate and connected to a first terminal supplied with a first voltage;
    an anti-fuse element provided on the semiconductor substrate and connected between the transistor and a second terminal supplied with a second voltage;
    a first resistive element provided on the semiconductor substrate and connected in parallel to the anti-fuse element and between the transistor and the second terminal; and
    a current supply unit including a current supply transistor provided on the semiconductor substrate, the current supply unit being configured to supply a current to the anti-fuse element and the first resistive element,
    wherein the current is configured to reduce a change in a voltage between both terminals of the first resistive element caused by a characteristic change of the first resistive element.

2. The semiconductor apparatus according to claim 1,
    wherein the current supply unit is connected to the second terminal, and
    wherein a second resistive element is connected to the second terminal via the current supply unit disposed therebetween.

3. The semiconductor apparatus according to claim 2,
    wherein the first resistive element and the second resistive element are formed by diffused resistors, respectively.

4. The semiconductor apparatus according to claim 2,
    wherein the current supply transistor includes a first transistor and a second transistor composing a current mirror circuit,
    wherein an external voltage is applied to a source of the first transistor and to a source of the second transistor,
    wherein a gate of the first transistor and a gate of the second transistor are connected to a drain of the first transistor,
    wherein the drain of the first transistor is connected to a terminal supplied with the first voltage via the second resistive element interposed therebetween, and
    wherein the drain of the second transistor is connected to the second terminal.

5. The semiconductor apparatus according to claim 1, further comprising:
    a switch connected between the current supply unit and the second terminal.

6. The semiconductor apparatus according to claim 5,
    wherein the switch is configured to be controlled so as to be in an off state in writing of information into the anti-fuse element and in an on state in reading out of information from the anti-fuse element.

7. The semiconductor apparatus according to claim 1, wherein the current supply unit is connected between the first terminal and the transistor.

8. The semiconductor apparatus according to claim 7, wherein the transistor operates in a saturation region when the anti-fuse element is in a conductive state, and wherein the transistor operates in a linear region when the anti-fuse element is in a non-conductive state.

9. The semiconductor apparatus according to claim 7, wherein the current supply unit is configured to supply a first amount of current in writing of information into the anti-fuse element and to supply a second amount of current in reading out of information from the anti-fuse element, and wherein the first amount of current is greater than the second amount of current.

10. The semiconductor apparatus according to claim 7, wherein the current supply transistor is configured so that an amount of current that the current supply transistor supplies is controlled in accordance with a voltage applied to a gate of the current supply transistor.

11. The semiconductor apparatus according to claim 1, further comprising:
a first memory unit and a second memory unit each including the anti-fuse element and the first resistive element,
wherein the current supply unit includes first and second current supply units corresponding to the first and second memory units, and
wherein the first memory unit is connected to the first current supply unit or the second current supply unit having a shorter connection line from the first resistive element in the first memory unit.

12. A liquid discharge head substrate comprising:
a plurality of discharge elements configured to discharge liquid;
a control circuit connected to the plurality of discharge elements; and
the semiconductor apparatus according to claim 1, which is connected to the control circuit.

13. A liquid discharge head comprising:
a recording portion including
the liquid discharge head substrate according to claim 12, and
a plurality of discharge ports configured to be provided for the respective plurality of discharge elements of the liquid discharge head substrate; and
an ink container configured to be mounted to the recording portion.

14. An apparatus comprising:
the liquid discharge head according to claim 13;
a carriage on which the liquid discharge head is mounted; and
a guide for moving the carriage.

15. A semiconductor apparatus comprising:
a semiconductor substrate;
a transistor provided on the semiconductor substrate and connected to a first terminal supplied with a first voltage;
an anti-fuse element provided on the semiconductor substrate and connected between the transistor and a second terminal supplied with a second voltage;
a first resistive element provided on the semiconductor substrate and connected in parallel to the anti-fuse element and between the transistor and the second terminal; and
an adjusting unit provided on the semiconductor substrate and configured to function so as to reduce an influence of variation in resistance of the first resistive element in reading out of information from the anti-fuse element;
wherein the adjusting unit is configured to supply a current to reduce a change in a voltage between both terminals of the first resistive element caused by a characteristic change of the first resistive element.

16. The semiconductor apparatus according to claim 15, wherein the adjusting unit includes a current supply unit which includes a current supply transistor provided on the semiconductor substrate and which supplies a current to the anti-fuse element and the first resistive element.

17. The semiconductor apparatus according to claim 16, wherein the current supply unit includes a variable current source.

18. The semiconductor apparatus according to claim 16, further comprising:
a second resistive element connected to the second terminal via the current supply unit interposed therebetween.

19. The semiconductor apparatus according to claim 15, wherein the adjusting unit includes a third terminal to which an external current is supplied and a second resistive element connected between the second terminal and the third terminal.

20. A liquid discharge head substrate comprising:
a plurality of discharge elements configured to discharge liquid;
a control circuit connected to the plurality of discharge elements; and
the semiconductor apparatus according to claim 15, which is connected to the control circuit.

21. A liquid discharge head comprising:
a recording portion including
the liquid discharge head substrate according to claim 20, and
a plurality of discharge ports configured to be provided for the respective plurality of discharge elements of the liquid discharge head substrate; and
an ink container configured to be mounted to the recording portion.

22. An apparatus comprising:
the liquid discharge head according to claim 21;
a carriage on which the liquid discharge head is mounted; and
a guide for moving the carriage.

* * * * *